United States Patent [19]

Main

[11] Patent Number: 4,977,381

[45] Date of Patent: Dec. 11, 1990

[54] DIFFERENTIAL RELAXATION OSCILLATOR

[75] Inventor: William E. Main, Mesa, Ariz.

[73] Assignee: Motorola, Inc., Schaumburg, Ill.

[21] Appl. No.: 361,474

[22] Filed: Jun. 2, 1989

[51] Int. Cl.⁵ .......................................... H03K 3/283
[52] U.S. Cl. ................................. 331/111; 331/113 R
[58] Field of Search .................... 331/111, 113 R, 143, 331/144

[56] References Cited

U.S. PATENT DOCUMENTS

| | | | |
|---|---|---|---|
| 3,725,681 | 4/1973 | Frederiksen | 331/111 X |
| 4,292,605 | 9/1981 | Rodgers, III | 331/113 R X |
| 4,492,914 | 1/1985 | Hitomi | 331/113 R X |
| 4,723,114 | 2/1988 | D'Arrigo et al. | 331/111 |
| 4,742,315 | 5/1988 | Schreilechner | 331/111 X |

Primary Examiner—Siegfried H. Grimm
Attorney, Agent, or Firm—Michael D. Bingham

[57] ABSTRACT

A relaxation oscillator is disclosed which includes first and second currents for charging and discharging a capacitor wherein the slew rate of the dynamic voltages developed at the terminals of the capacitor remain substantially constant for each frequency of operation which desensitizes the oscillator to the effects of the inherent stray capacitance, and improves the accuracy of the output frequency. A circuit monitors the dynamic voltage across the capacitor and inverts a control signal at opposite polarities of a particular threshold. A bistable circuit provides first and second complementary output signals in response to the control signal from the circuit. The first and second complementary output signals drive a pair of switching transistors which alternate the direction of current flowing through the capacitor so as to provide smooth voltage transitions at the terminals of the capacitor.

17 Claims, 3 Drawing Sheets

DIFFERENTIAL RELAXATION OSCILLATOR

BACKGROUND OF THE INVENTION

The present invention relates in general to oscillators and, more particularly, to a relaxation oscillator circuit for providing smooth voltage transitions at the terminals of a charging capacitor which desensitizes the oscillator to the effects of the inherent stray capacitance and improves the accuracy of the output frequency.

Oscillators are used in many well known applications including FM (frequency modulation) demodulators. In FM transmissions, the instantaneous frequency of the FM signal will vary in relation to the information content of the baseband signal which is modulated onto the FM carrier. Within the FM demodulator, the instantaneous frequency of the FM signal is compared to the oscillator frequency which is typically tuned to the carrier or center frequency of the operating spectrum of the FM signal. Generally, the FM demodulator provides an amplitude modulated output signal which is proportional to the deviation of the frequency of the FM signal from the tuned center frequency of the oscillator. Any inaccuracies in the oscillator frequency can directly effect the magnitude of the frequency deviation which may cause misinterpretation of the FM signal. Hence, the accuracy and stability of the relaxation oscillator is critical to the proper operation of the FM demodulator.

Relaxation-type oscillators typically include a capacitor which charges and discharges between trip threshold potentials and a switching circuit which alternates the direction of charge on the capacitor. One such relaxation oscillator uses first and second transistors as the switching circuit having the collectors cross-coupled to the bases, and a floating capacitor which is coupled between the emitters of the transistors. The emitters are commonly connected to a constant current supply. The first and second transistors alternately turn on and off as determined by the charge and discharge rate of the floating capacitor which defines the frequency of the oscillator.

One draw back to the conventional oscillator is the inherent sudden voltage jumps at the terminals of the floating capacitor the instant that the transistors change state. Ideally, these sudden voltage jumps are equal in magnitude; however, the effects of the stray capacitance, principally associated with the terminals of the floating capacitor, cause the voltage jumps to be non-symmetrical which tends to shorten the discharge times of the floating capacitor thereby increasing the output frequency. In addition, the derivative of the voltage across the capacitor ($V_c$) with respect to time ($dV_c/dt$) becomes very large at the transistor switching times. Since the current through the capacitor is proportional to $dV_c/dt$, the sudden voltage jumps may saturate the collector-emitter conduction path as the transistor turns on. The saturation of the transistors adversely effects the charge and discharge rate of the capacitor, and consequently degrades the accuracy of the oscillator frequency.

Hence, there exist a need for a relaxation oscillator which eliminates the sudden voltage jumps at the terminals of the capacitor which allows the improved oscillator to operate with greater accuracy at higher frequencies.

SUMMARY OF THE INVENTION

It is therefore an objective of the present invention to provide an improved oscillator.

Another objective of the present invention is to provide an improved relaxation oscillator in which the slew rate of the voltages at the terminals of the charging capacitor remains substantially constant for each frequency of operation.

Still another objective is to provide an improved relaxation oscillator which may operate at higher frequencies and greater accuracy as compared to conventional relaxation oscillators.

In accordance with the above and other objectives there is provided an oscillator, comprising a current supply having first and second outputs for providing first and second currents; a capacitor having first and second terminals which are coupled between the first and second outputs of the current supply for developing first and second dynamic voltages in response to the first and second currents flowing therethrough; a switching circuit which is coupled between the first and second outputs of the current supply for alternately switching the current flow of the first and second currents flowing through the capacitor; and a circuit which is responsive to the first and second dynamic voltages for controlling the switching rate of the switching circuit wherein the slew rate of the first and second dynamic voltages remains substantially constant for each frequency of operation.

DETAILED DESCRIPTION OF PRIOR ART

Figure 1:
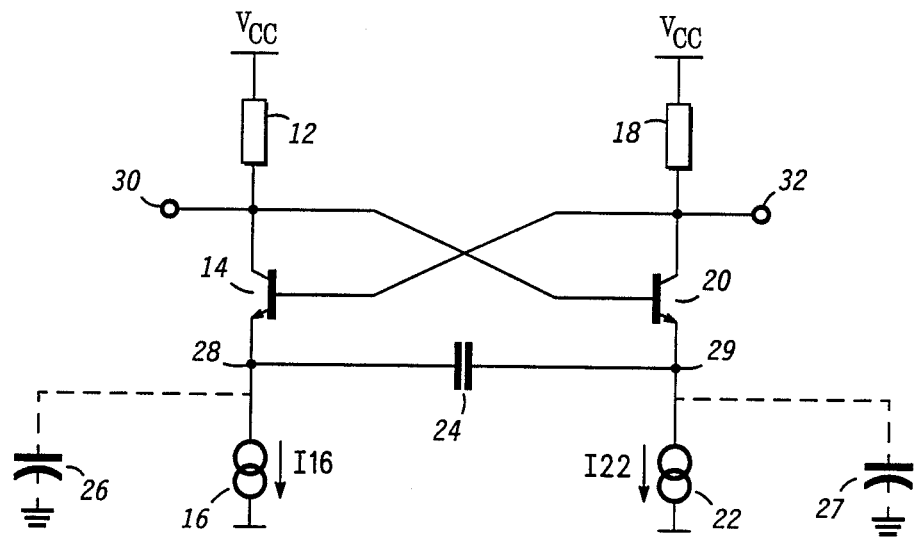
FIG. 1 is a schematic diagram showing a known relaxation oscillator.

Oscillator 10, as shown in FIG. 1, is a typical relaxation oscillator which is well known in the art. The following discussion includes the operation of the known relaxation oscillator and the problems associated therewith. Assuming ideal transistors which have negligible base currents and equal emitter areas, oscillator 10 includes a first current path comprising resistor 12, the collector-emitter conduction path of transistor 14 and current supply 16, and a second current path comprising resistor 18, the collector-emitter conduction path of transistor 20 and current supply 22. The collectors and bases of transistors 14 and 20 are cross-coupled as shown. Capacitor 24 has first and second terminals which are coupled to the emitters of transistors 14 and 20 respectively. Capacitors 26 and 27 are shown as being coupled to nodes 28 and 29 to illustrate the inherent stray capacitance to ground associated with the terminals of capacitor 24. Differential outputs 30 and 32 are provided at the collectors of transistors 14 and 20 respectively.

Assuming that transistor 14 is initially turned on and that the voltage at node 29 is more positive than the voltage at node 28, a first current flows through resistor 12 and transistor 14. The voltage at base of transistor 14 is maintained substantially equal to $V_{CC}$ since the current flowing in resistor 18 is negligible. A voltage equal to the supply voltage, $V_{CC}$, minus the potential developed across resistor 12 due to to the first current is developed at the base of transistor 20. The potential difference between the base of transistor 20 and node 29 is less than the cutin potential (minimum $V_{be}$ required to turn the transistor on) of the base-emitter junction of transistor 20 causing it to be turned off. Current $I_{22}$ which flows through capacitor 24 into current supply 22 discharges the second terminal of capacitor 24 thereby reducing the voltage at node 29 until the base-emitter junction of transistor 20 becomes forward biased. The instant that transistor 20 turns on, the second current develops a voltage across resistor 18 which sharply reduces the voltage at the base of transistor 14 and turns it off. Consequently, the first current stops flowing causing the voltage at the collector of transistor 14 to jump up to a value approximately equal to $V_{CC}$. The voltage at node 29 correspondingly jumps up to a level equal to $V_{CC}-V_{20}$ where $V_{20}$ is the base-emitter voltage ($V_{be}$) of transistor 20. Ideally, the voltages at nodes 28 and 29 should jump up by the same magnitude since capacitor 24 is floating with respect to ground. The current $I_{16}$ flowing into current supply 16 would then discharge the first terminal of capacitor 24 thereby reducing the voltage at node 28 until the base-emitter junction of transistor 14 becomes forward biased which turns transistor 14 on and ultimately turns transistor 20 off. In theory, this cycle repeats at a particular frequency as determined by the value of capacitor 24 and the magnitudes of currents $I_{16}$ and $I_{22}$.

In actual practice, the operation of oscillator 10 is sensitive to the effects of stray capacitors 26 and 27. Capacitor 24, in combination with either capacitor 26 or 27, constitutes a voltage divider circuit as seen from the opposite node. For example, as transistor 20 turns on, the voltage at node 29 with respect to ground potential ($V_{29}$) jumps up by a particular magnitude. The voltage divider configuration of capacitors 24 and 26 causes the voltage at node 28 with respect to ground potential ($V_{28}$) to jump up by a lesser magnitude as compared to the jump of voltage $V_{29}$. Hence, current $I_{16}$ requires less time to discharge the first terminal of capacitor 24 to the cutin threshold of transistor 14. Likewise, as transistor 14 turns on, voltage $V_{29}$ jumps up by a lesser magnitude as compared to voltage $V_{28}$, and current $I_{22}$ then requires less time to discharge the second terminal of capacitor 24 to the cutin threshold of transistor 20. The shortened discharge times increases the frequency of oscillation creating a frequency error between the actual frequency and the tuned frequency of operation. Also, as previously discussed, the sudden voltage jumps tend to create large $dV_c/dt$ causing the collector-emitter conduction path of the corresponding transistors to become saturated at turn on which adversely effects the charge and discharge rate of the capacitor, and consequently degrades the accuracy of the oscillator frequency. Finally, if stray capacitors 26 and 27 were of unequal value then oscillator 10 would not operate with a fifty percent duty cycle. A 50/50 mark and space relationship is desirable in most such oscillator applications.

DETAILED DESCRIPTION OF THE PREFERRED EMBODIMENT

Figure 2:
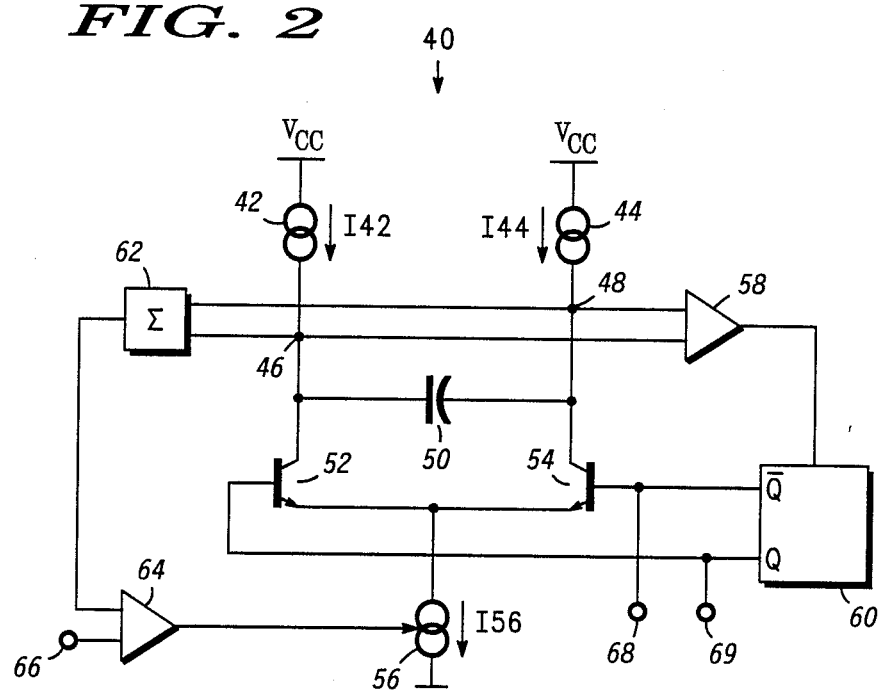
FIG. 2 is a simplified diagram illustrating the preferred embodiment of the present invention.

With reference to FIG. 2, oscillator 40 is a simplified schematic and block diagram of the preferred embodiment of the present invention. Current supplies 42 and 44 receive a power supply voltage, typically $V_{CC}$, for providing constant currents $I_{42}$ and $I_{44}$. Nodes 46 and 48 are coupled between current supplies 42 and 44 and the collectors of differential transistors 52 and 54 respectively. The first and second terminals of capacitor 50 are also coupled to nodes 46 and 48. The emitters of transistors 52 and 54 are coupled together to current supply 56 for sinking current $I_{56}$. The differential configuration of transistors 52 and 54 and floating capacitor 50 is desirable because it reduces the high frequency coupling between oscillator 40 and the power supplies.

Circuit 58 is responsive to predetermined levels of the voltage across capacitor 50 ($V_{50}$) for providing a control signal which is either high or low depending upon the magnitude and polarity of $V_{50}$. Bistable circuit 60 receives the control signal from circuit 50 and provides first and second complementary output signals which drives the bases of transistors 52 and 54 respectively. Summing circuit 62 is also responsive to voltage $V_{50}$ for providing a feedback signal to control circuit 64 for driving the control input of current supply 56 which adjusts the magnitude of current $I_{56}$ to equal the sum of currents $I_{42}$ and $I_{44}$. An external reference signal is applied to bias input 66 for providing means to set the average DC (direct current) voltage at the terminals of capacitor 50 to a convenient value typically midway between $V_{CC}$ and the collector saturation potential of transistors 52 and 54. Differential outputs 68 and 69 of oscillator 40 are provided at the first and second outputs of bistable circuit 60 respectively.

The operation of oscillator 40 is now discussed in detail assuming ideal transistors having negligible base currents and equal emitter areas. The initial assumption is made that the first output signal of bistable circuit 60 is high, while its complementary output signal is low. At the same time, the potential at node 46 is positive with respect to node 48. Accordingly, transistor 52 will be turned on and transistor 54 turned off. Current $I_{42}$ flows through the collector-emitter conduction path of transistor 52 into current supply 56. Current $I_{44}$ flows through capacitor 50 before combining with current $I_{42}$ in the collector of transistor 52 thereby charging capacitor 50 which increases the voltage with respect to ground at node 48 ($V_{48}$), and decreases the voltage with respect to ground at node 46 ($V_{46}$) which drives voltage $V_{50}$ toward the opposite polarity (node 48 positive with respect to node 46). Circuit 58 senses the the change in polarity of $V_{50}$ and, at a predetermined threshold, inverts its control signal. The first and second output signals of bistable circuit 60 then change state which turns transistor 52 off and transistor 54 on. Current $I_{44}$ then flows through transistor 54 and current $I_{42}$ flows through capacitor 50 thereby charging capacitor 50 in the reverse direction which will invert the polarity of $V_{50}$ again and complete the cycle. The frequency of oscillation is principally determined by the value of capacitor 50, the magnitude of currents $I_{42}$ and $I_{44}$ and the predetermined voltage thresholds of circuit 58 ($V_{50}$). For applications requiring real time control of the oscillator frequency, either current $I_{56}$ or currents $I_{42}$ and $I_{44}$ are typically utilized as the controlling means. Note the predetermined thresholds of circuit 58 and currents $I_{42}$ and $I_{44}$ are independent which provides improved control of the operating frequency of the oscillator.

A key point to note is that voltages $V_{46}$ and $V_{48}$ do not jump up at the switching times of transistors 52 and 54, but rather transition through smooth complementary rises and falls about some average DC value in what may be visually related to a "seesaw" motion wherein the average DC value corresponds to the pivot point. For example, if transistor 52 is conducting, voltage $V_{46}$ is falling and voltage $V_{48}$ is rising each with respect to ground. At a first predetermined value of $V_{50}$, circuit 58 trips bistable circuit 60 which turns off transistor 52 and turns on transistor 54 which reverses the direction of current flowing through capacitor 50. Voltage $V_{48}$ then stops rising and begins to fall and likewise, voltage $V_{46}$ ceases its decline and begins to rise without the sudden jumps as seen in the operation of conventional oscillator 10. Voltage $V_{46}$ continues to rise and voltage $V_{48}$ continues to fall until voltage $V_{50}$ reaches a second predetermined value of $V_{50}$ having opposite polarity relative to the first predetermined value of $V_{50}$. Circuit 58 trips again turning off transistor 54 and turning on transistor 52 thereby reversing the direction of current flowing through capacitor 50 and completing the cycle. The present invention has not eliminated the stray capacitance, but rather has maintained the slew rate of voltage $V_{50}$ (rate of change of the voltage per unit of time, i.e., dV/dt) substantially constant for each frequency of operation, and thereby eliminated the aforedescribed adverse effects attributed to the stray capacitance allowing oscillator 40 to operate at a higher frequency as compared to oscillator 10.

Figure 3:
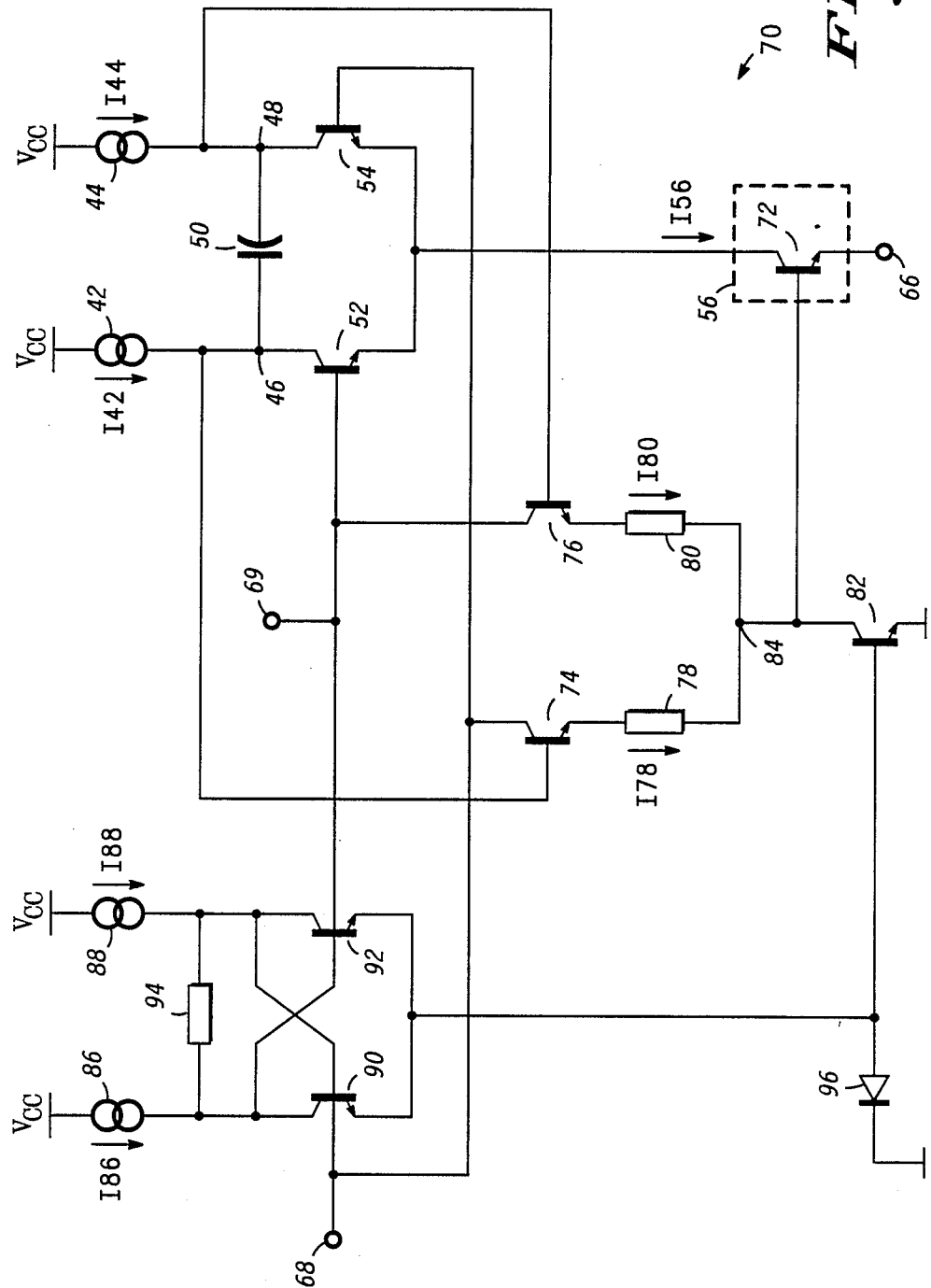
FIG. 3 is a more detailed schematic diagram of the preferred embodiment of FIG. 2.

The preferred embodiment of the present invention is shown in much greater detail in FIG. 3. Circuit elements with similar functions are given the same reference numbers as used in FIG. 2. The aforedescribed operation of current supplies 42 and 44, capacitor 50 and transistors 52 and 54 is still applicable. Current supply 56 now comprises transistor 72 having a collector and an emitter which are coupled between the emitters of transistors 52 and 54 and bias input 66 respectively. A voltage is applied to bias input 66 to level shift the average DC voltage at the terminals of capacitor 50 to a convenient value. The bases of transistors 74 and 76 are coupled to nodes 46 and 48 respectively for monitoring the voltage across capacitor 50. Resistors 78 and 80 are coupled between the emitters of transistors 74 and 76 and the collector of transistor 82. Currents $I_{78}$ and $I_{80}$ flow through resistors 78 and 80 into summing node 84 and through the collector-emitter conduction path of transistor 82. The collector of transistor 82 is coupled to the base of transistor 72. Current supplies 86 and 88 are coupled to a source of operating potential, typically $V_{CC}$, for providing currents $I_{86}$ and $I_{88}$. The bases and collectors of transistors 90 and 92 are cross-coupled as shown. Resistor 94 is coupled between the collectors of transistors 90 and 92 for limiting the voltage at the bases of transistors 90 and 92. The emitters of transistors 90 and 92 are coupled together to diode 96, hence, the sum of currents flowing through diode 96 and transistor 82 is equal to the sum of currents $I_{86}$ and $I_{88}$. Note that diode 96 may be formed with a transistor having its base and collector shorted together. The anode of diode 96 is coupled to the base of transistor 82 forming a current mirror therewith to maintain the sum of currents $I_{78}$ and $I_{80}$ substantially constant. Therefore, the sum of the voltages across resistors 78 and 80 is constant due to the constant current flowing in transistor 82. Any imbalance between current $I_{56}$ and the sum of current $I_{42}$ and $I_{44}$ is seen as a change in voltage at the bases of transistors 74 and 76 which is translated to an equal change in the voltage at node 84 which adjusts the base of transistor 72 to restore the balanced condition.

The discussion of oscillator 70 continues assuming that transistor 52 is turned on, and that voltage $V_{46}$ is positive with respect to $V_{48}$; turning on transistor 74. The current flowing through the collector-emitter conduction path of transistor 74 sinks current from the base of transistor 90 which turns the latter off. The lesser voltage $V_{48}$ reduces the drive of transistor 76 to a sufficient level to release the base of transistor 92 which allows it to turn on. Current $I_{88}$ then flows through the collector-emitter conduction path of transistor 92 while current $I_{86}$ flows through resistor 94 before combining with current $I_{88}$ in the collector of transistor 92. A voltage is developed across resistor 94 to maintain the base-emitter junctions of transistors 92 and 52 forward biased, and the base-emitter junctions of transistors 90 and 54 unbiased until such a time as voltages $V_{46}$ and $V_{48}$ have reversed polarity which turns on transistor 76. Transistors 90 and 54 turn on and transistor 92 turns off which reverses the polarity of the voltage across resistor 94. The base-emitter junctions of transistors 90 and 54 remain forward biased and the base-emitter junctions of transistors 92 and 52 unbiased until the polarity of voltage $V_{50}$ changes again.

Figure 4:
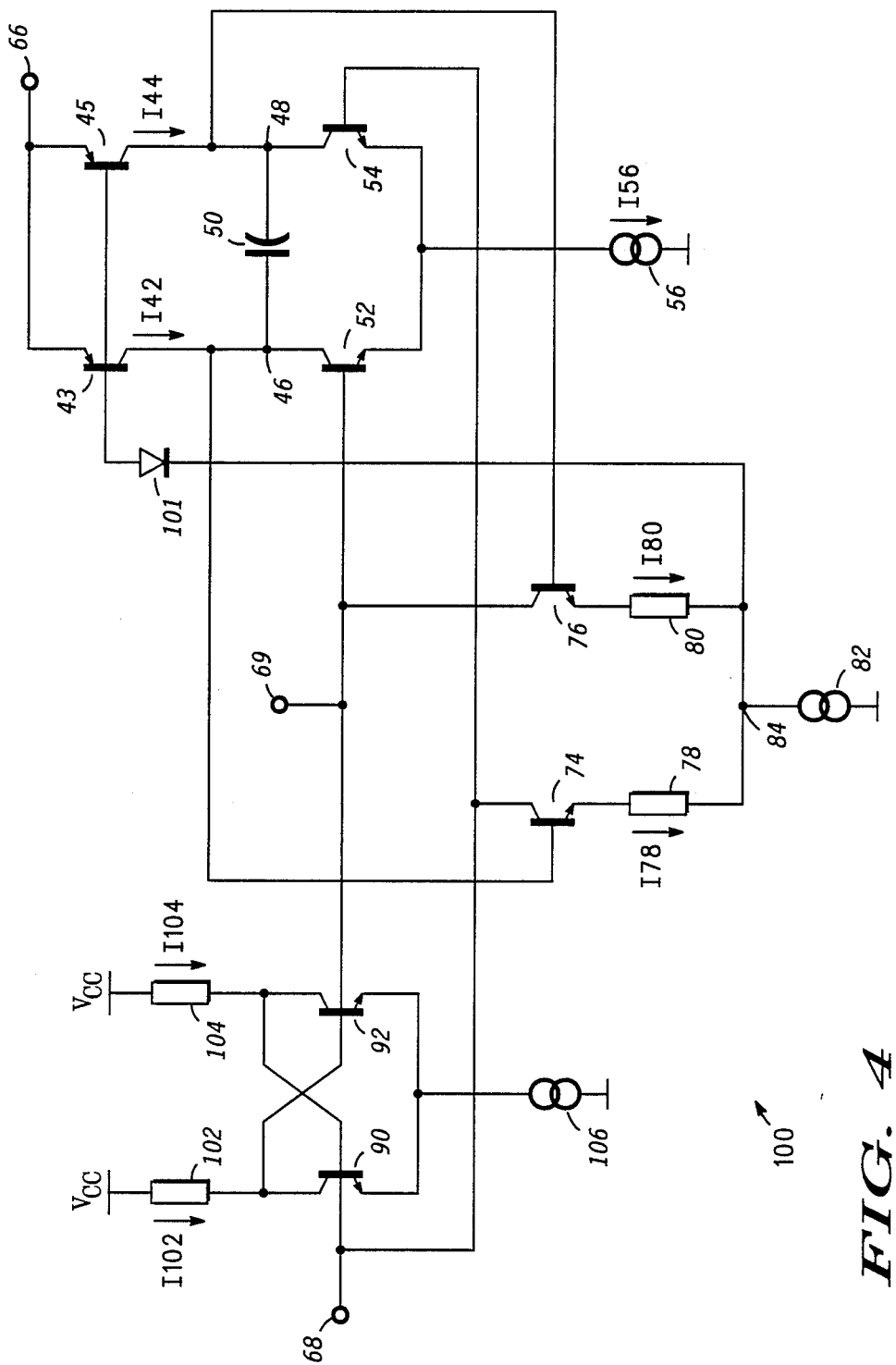
FIG. 4 is detailed schematic diagram of an alternate embodiment of the present invention.

An alternate embodiment of the present invention is illustrated in FIG. 4. Oscillator 100 includes means to control current supplies 42 and 44 as opposed to controlling current supply 56 as was done in oscillator 70. Current supplies 42 and 44 comprise transistors 43 and 45 respectively having their bases coupled through diode 101 to summing node 84. Diode 101 may be formed with a transistor having its base and collector shorted together. Bias input 66 is now coupled to the emitters of transistors 43 and 45. The aforedescribed configuration of transistors 52 and 54 and capacitor 50 is still applicable. The sum of currents $I_{78}$ and $I_{80}$ flowing through transistors 74 and 76 and resistors 78 and 80 respectively are again equal to the constant current flowing through current supply 82. Hence, the sum of the voltages across resistors 78 and 80 is also constant. For instance, if the sum of currents $I_{42}$ and $I_{44}$ was greater than current $I_{56}$ then the voltages at the bases of transistors 74 and 76 would rise which would increase the voltage at node 84. This would level shift the voltage across diode 101, thus increasing the voltage at the bases of transistors 43 and 45 which would reduce currents $I_{42}$ and $I_{44}$ so as to restore a balanced condition with respect to current $I_{56}$. Resistors 102 and 104 are coupled between a power supply conductor and the collector-emitter conduction paths of transistors 90 and 92 respectively. The bases and collectors of transistor 90 and 92 are cross-coupled as shown. The emitters of transistors 90 and 92 are coupled together to current supply 106. Assuming transistor 92 is turned on and transistor 90 is turned off, a voltage is developed across resistor 104, due to current $I_{104}$, which will turn off transistors 90 and 54. Since negligible current flows though resistor 102, the voltage at base of transistor 92 approximately equal to $V_{CC}$ maintains the base-emitter junctions of transistors 92 and 52 forward biased. As polarity of $V_{50}$ reverses, transistors 76 and 90 are turned on and a voltage is developed across resistor 102, due to current $I_{102}$, which will turn off transistors 92 and 52. Since negligible current flows though resistor 104, the voltage at base of transistor 90, approximately equal to $V_{CC}$, maintains the base-emitter junctions of transistors 90 and 54 forward biased until $V_{50}$ reverses again.

What has been provided therefore is a novel relaxation oscillator which provides means to eliminate the sudden voltage jumps which will desensitize the oscillator to the adverse effects of the stray capacitance and improves the accuracy of the output frequency. While there have been described above the principles of the invention in conjunction with a specific apparatus, it is clearly understood that this description is made only by way of example and is not a limitation of the scope of the invention.

I claim:

1. An oscillator, comprising:
   first current supply means for providing first and second currents at first and second outputs;
   second current supply means for providing a current substantially equal to the sum of said first and second currents;
   capacitive means coupled between said first and second outputs of said first current supply means for developing first and second dynamic voltages;
   switching means having first and second inputs coupled to said first and second outputs of said first current supply means respectively and having an output coupled to said second current supply means wherein said switching means is responsive to first and second complementary control signals for alternately switching the current flow of said first and second currents flowing through said capacitive means;
   first means responsive to said first and second dynamic voltages for providing said first and second complementary control signals to control the switching of said switching means wherein the magnitude of the slew rate of said first and second dynamic voltages remains substantially constant for each frequency of operation; and
   second means responsive to said first and second dynamic voltages for controlling said first current supply means or said second current supply means to maintain the magnitude of the DC (direct current) voltage developed across said capacitive means at a predetermined value.

2. The oscillator of claim 1 wherein said switching means comprises:
   a first transistor having a collector coupled to said first output of said first current supply means and having a base and an emitter; and
   a second transistor having a base, an emitter and collector, said collector being coupled to said second output of said first current supply means, said bases of said first and second transistor being responsive to said first and second complementary control signals provided by said first means, said emitters of said first and second transistors being coupled together to said second current supply means.

3. The oscillator of claim 2 wherein said first means comprises:
   a third transistor having a base, an emitter and a collector, said collector being coupled to said base of said second transistor, said base being coupled to said collector of said first transistor;
   a fourth transistor having a base, an emitter and a collector, said collector being coupled to said base of said first transistor, said base being coupled to said collector of said second transistor;
   a first resistor having a first terminal coupled to said emitter of said third transistor and having a second terminal coupled to a first source of operating potential; and
   a second resistor having a first terminal coupled to said emitter of said fourth transistor and having a second terminal coupled to said first source of operating potential.

4. The oscillator of claim 3 wherein said first means further comprises:
   third current supply means for providing a current of predetermined magnitude;
   a fifth transistor having a base, an emitter and a collector, said collector being coupled to said base of said first transistor for providing said first complementary control signal, said base being coupled to said base of said second transistor;
   a sixth transistor having a base, an emitter and a collector, said collector being coupled to said base of said fifth transistor for providing said second complementary control signal, said base being coupled to said collector of said fifth transistor, said emitters of said fifth and sixth transistors being coupled together to said third current supply means;
   a third resistor coupled between a second source of operating potential and said collector of said fifth transistor; and
   a fourth resistor coupled between said second source of operating potential and said collector of said sixth transistor.

5. The oscillator of claim 4 wherein said second means comprises:
   a summing node coupled between said second terminals of said first and second resistors;
   fourth current supply means coupled between said summing node and said first source of operating potential for providing a current of predetermined magnitude; and
   diode means having a cathode coupled to said summing node and having an anode.

6. The oscillator of claim 5 wherein said first current supply means comprises;
   a seventh transistor having a base, an emitter and a collector coupled to said collector of said first transistor; and
   an eighth transistor having a base, an emitter and a collector, said collector being coupled to said collector of said second transistor, said emitters of said seventh and eighth transistors being coupled together to a terminal at which a voltage is applied, said bases of said seventh and eighth transistors being coupled to said anode of said diode means.

7. The oscillator of claim 3 wherein said first means further comprises:
   third current supply means having first and second outputs for providing first and second currents;
   a fifth transistor having a base, an emitter and a collector, said collector being coupled to said first output of said third current supply means and to said base of said first transistor for providing said first complementary control signal, said emitter being coupled to said first source of operating potential;
   a sixth transistor having a base, an emitter and a collector, said collector being coupled to said base of said fifth transistor and to said second output of said third current supply means, said collector also being coupled to said base of said second transistor for providing said second complementary control signal, said base being coupled to said collector of said fifth transistor, said emitter being coupled to said first source of operating potential; and a third resistor coupled between said collectors of said fifth and sixth transistors.

8. The oscillator of claim 7 wherein said second means comprises:
a summing node coupled between said second terminals of said first and second resistors;
a seventh transistor having a base, an emitter and a collector, said collector being coupled to said summing node, said emitter being coupled to said first source of operating potential; and
diode means having an anode coupled to said emitters of said fifth and sixth transistors and to said base of said seventh transistor and having a cathode coupled to said first source of operating potential.

9. The oscillator of claim 8 wherein said second current supply means comprises an eighth transistor having a base, an emitter and a collector, said collector being coupled to said emitters of said first and second transistors, said emitter being coupled to a terminal at which a voltage is applied, said base being coupled to said collector of said seventh transistor.

10. An integrated oscillator, comprising:
first current supply means for providing first and second currents at first and second outputs;
second current supply means for providing a current substantially equal to the sum of said first and second currents;
capacitive means coupled between said first and second outputs of said first current supply means for developing first and second dynamic voltages;
switching means having first and second inputs coupled to said first and second outputs of said first current supply means respectively and having an output coupled to said second current supply means wherein said switching means is responsive to first and second complementary control signals for alternately switching the current flow of said first and second currents flowing through said capacitive means;
first means responsive to said first and second dynamic voltages for providing said first and second complementary control signals to control the switching of said switching means wherein the magnitude of the slew rate of said first and second dynamic voltages remains substantially constant for each frequency of operation; and
second means responsive to said first and second dynamic voltages for controlling said first current supply means or said second current supply means to maintain the magnitude of the DC voltage developed across said capacitive means at a predetermined value.

11. An oscillator, comprising:
first current supply means for providing first and second currents at first and second outputs;
second current supply means for providing a current substantially equal to the sum of said first and second currents;
capacitive means coupled between said first and second outputs of said first current supply means for developing first and second dynamic voltages;
a first transistor having a collector coupled to said first output of said first current supply means and having a base and an emitter;
a second transistor having a base, an emitter and collector, said collector being coupled to said second output of said first current supply means, said bases of said first and second transistors being responsive to first and second complementary control signals, said emitters of said first and second transistors being coupled together to said second current supply means;
a third transistor having a base, an emitter and a collector, said collector being coupled to said base of said second transistor, said base being coupled to said collector of said first transistor;
a fourth transistor having a base, an emitter and a collector, said collector being coupled to said base of said first transistor, said base being coupled to said collector of said second transistor;
a first resistor having a first terminal coupled to said emitter of said third transistor and having a second terminal coupled to a first source of operating potential;
a second resistor having a first terminal coupled to said emitter of said fourth transistor and having a second terminal coupled to said first source of operating potential;
a bistable circuit having first and second outputs for providing said first and second complementary control signals to control the switching of said switching means; and
circuit means responsive to said first and second dynamic voltages for controlling said first current supply means or said second current supply means to maintain the magnitude of the DC voltage developed across said capacitive means at a predetermined value.

12. The oscillator of claim 11 wherein said bistable circuit comprises:
third current supply means for providing a current of predetermined magnitude;
a fifth transistor having a base, an emitter and a collector, said collector being coupled to said base of said first transistor for providing said first complementary control signal, said base being coupled to said base of said second transistor;
a sixth transistor having a base, an emitter and a collector, said collector being coupled to said base of said fifth transistor for providing said second complementary control signal, said base being coupled to said collector of said fifth transistor, said emitters of said fifth and sixth transistors being coupled together to said third current supply means;
a third resistor coupled between a second source of operating potential and said collector of said fifth transistor; and
a fourth resistor coupled between said second source of operating potential and said collector of said sixth transistor.

13. The oscillator of claim 12 wherein said circuit means comprises:
a summing node coupled between said second terminals of said first and second resistors;
fourth current supply means coupled between said summing node and said first source of operating potential for providing a current of predetermined magnitude; and
diode means having a cathode coupled to said summing node and having an anode.

14. The oscillator of claim 13 wherein said first current supply means comprises;
a seventh transistor having a base, an emitter and a collector coupled to said collector of said first transistor; and an eighth transistor having a base, an emitter and a collector, said collector being coupled to said collector of said second transistor, said emitters of said seventh and eighth transistors being coupled together to a terminal at which a voltage is applied, said bases of said seventh and eighth transistors being coupled to said anode of said diode means.

15. The oscillator of claim 11 wherein said bistable circuit comprises:

third current supply means having first and second outputs for providing first and second currents;

a fifth transistor having a base, an emitter and a collector, said collector being coupled to said first output of said third current supply means and to said base of said first transistor for providing said first complementary control signal, said emitter being coupled to said first source of operating potential;

a sixth transistor having a base, an emitter and a collector, said collector being coupled to said base of said fifth transistor and to said second output of said third current supply means, said collector also being coupled to said base of said second transistor for providing said second complementary control signal, said base being coupled to said collector of said fifth transistor, said emitter being coupled to said first source of operating potential; and a third resistor coupled between said collectors of said fifth and sixth transistors.

16. The oscillator of claim 15 wherein said circuit means comprises:

a summing node coupled between said second terminals of said first and second resistors;

a seventh transistor having a base, an emitter and a collector, said collector being coupled to said summing node, said emitter being coupled to said first source of operating potential; and diode means having an anode coupled to said emitters of said fifth and sixth transistors and to said base of said seventh transistor and having a cathode coupled to said first source of operating potential.

17. The oscillator of claim 16 wherein said second current supply means comprises an eighth transistor having a base, an emitter and a collector, said collector being coupled to said emitters of said first and second transistors, said emitter being coupled to a terminal at which a voltage is applied, said base being coupled to said collector of said seventh transistor.

* * * * *